(12) United States Patent
Li

(10) Patent No.: US 11,490,466 B2
(45) Date of Patent: Nov. 1, 2022

(54) MELT DEPTH DETERMINATION USING INFRARED INTERFEROMETRIC TECHNIQUE IN PULSED LASER ANNEALING

(71) Applicant: Applied Materials, Inc., Santa Clara, CA (US)

(72) Inventor: Jiping Li, Palo Alto, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 828 days.

(21) Appl. No.: 16/277,409

(22) Filed: Feb. 15, 2019

(65) Prior Publication Data
US 2019/0182907 A1    Jun. 13, 2019

Related U.S. Application Data

(62) Division of application No. 13/906,118, filed on May 30, 2013, now Pat. No. 10,219,325.
(Continued)

(51) Int. Cl.
*F21V 7/00* (2006.01)
*G02B 17/00* (2006.01)
(Continued)

(52) U.S. Cl.
CPC .......... *H05B 6/00* (2013.01); *G01B 11/0625* (2013.01); *G01B 11/0675* (2013.01);
(Continued)

(58) Field of Classification Search
CPC ......... H01L 21/67248; H01L 21/67253; H01L 21/67115; G01B 11/0625; G01B 11/0675; H05B 6/00
(Continued)

(56) References Cited

U.S. PATENT DOCUMENTS 4,436,557 A * 3/1984 Wood .................... H01L 31/068
257/655
5,105,433 A * 4/1992 Eisele ................. H01S 5/06255
385/8
(Continued)

FOREIGN PATENT DOCUMENTS

EP           1926125 A1    5/2008
JP         H05-275336 A   10/1993
(Continued)

OTHER PUBLICATIONS

Chinese Office Action dated Mar. 27, 2019, for Chinese Patent Application No. 201710486531.X.
(Continued)

*Primary Examiner* — Eric S Stapleton
(74) *Attorney, Agent, or Firm* — Patterson + Sheridan, LLP

(57) ABSTRACT

Methods and apparatus for measuring the melt depth of a substrate during pulsed laser melting are provided. The apparatus can include a heat source, a substrate support with an opening formed therein, and an interferometer positioned to direct coherent radiation toward the toward the substrate support. The method can include positioning the substrate with a first surface in a thermal processing chamber, heating a portion of the first surface with a heat source, directing infrared spectrum radiation at a partially reflective mirror creating control radiation and interference radiation, directing the interference radiation to a melted surface and directing the control radiation to a control surface, and measuring the interference between the reflected radiation. The interference fringe pattern can be used to determine the precise melt depth during the melt process.

20 Claims, 7 Drawing Sheets

Related U.S. Application Data

(60) Provisional application No. 61/658,282, filed on Jun. 11, 2012.

(51) Int. Cl.
    *H05B 6/00* (2006.01)
    *G01B 11/06* (2006.01)
    *H01L 21/67* (2006.01)

(52) U.S. Cl.
    CPC .. *H01L 21/67248* (2013.01); *H01L 21/67253* (2013.01); *H01L 21/67115* (2013.01)

(58) Field of Classification Search
    USPC ....................................................... 392/422
    See application file for complete search history.

(56) References Cited

U.S. PATENT DOCUMENTS

| | | | | |
|---|---|---|---|---|
| 5,233,191 A * | 8/1993 | Noguchi | ........... | H01L 21/67288 850/10 |
| 5,742,384 A * | 4/1998 | Farmer | ........... | G01S 7/495 372/24 |
| 5,830,277 A * | 11/1998 | Johnsgard | ........... | H01L 21/67248 118/712 |
| 5,895,972 A * | 4/1999 | Paniccia | ........... | G01R 31/311 257/796 |
| 6,002,109 A * | 12/1999 | Johnsgard | ........... | C23C 16/46 219/390 |
| 6,095,083 A * | 8/2000 | Rice | ........... | C23C 16/517 118/724 |
| 6,129,807 A * | 10/2000 | Grimbergen | ........... | H01J 37/32458 118/712 |
| 6,331,885 B1 * | 12/2001 | Nishi | ........... | G03F 7/70708 356/399 |
| 6,479,801 B1 * | 11/2002 | Shigeoka | ........... | G01J 5/0887 392/416 |
| 6,549,277 B1 * | 4/2003 | Narushima | ........... | G01J 1/42 356/218 |
| 6,656,749 B1 * | 12/2003 | Paton | ........... | H01L 29/6659 438/18 |
| 6,941,063 B2 * | 9/2005 | Camm | ........... | H01L 21/2686 219/390 |
| 7,280,028 B2 * | 10/2007 | Nelson | ........... | G01K 7/18 73/53.01 |
| 7,351,638 B1 * | 4/2008 | Tabery | ........... | H01L 21/268 257/E21.328 |
| 7,473,657 B2 * | 1/2009 | Okumura | ........... | H01L 22/12 257/E21.531 |
| 7,569,463 B2 * | 8/2009 | Balakrishna | ........... | H01L 21/324 438/510 |
| 7,615,499 B2 * | 11/2009 | Chung | ........... | H01L 21/3247 438/770 |
| 7,642,205 B2 * | 1/2010 | Timans | ........... | H01L 21/67115 438/795 |
| 7,800,081 B2 * | 9/2010 | Moffatt | ........... | H01L 21/268 438/795 |
| 7,816,152 B2 * | 10/2010 | Yoo | ........... | H01L 22/14 324/71.5 |
| 8,011,319 B2 * | 9/2011 | Chung | ........... | H01L 21/02178 438/770 |
| 8,138,105 B2 * | 3/2012 | Timans | ........... | H01L 21/67115 257/E23.101 |
| 8,557,721 B2 * | 10/2013 | Timans | ........... | H01L 21/67115 257/E23.101 |
| 2001/0036805 A1 * | 11/2001 | Birang | ........... | B24B 47/12 451/550 |
| 2001/0044119 A1 * | 11/2001 | Ghadiri | ........... | G01N 33/5438 435/7.1 |
| 2002/0078889 A1 * | 6/2002 | Welch | ........... | H01L 21/67259 118/668 |
| 2002/0187253 A1 * | 12/2002 | Marcus | ........... | H01L 51/001 118/712 |
| 2003/0183612 A1 * | 10/2003 | Timans | ........... | H01L 21/67248 219/390 |
| 2004/0229386 A1 * | 11/2004 | Golovchenko | .. | G01N 33/48721 438/10 |
| 2005/0252454 A1 * | 11/2005 | Parkhe | ........... | H01L 21/6831 118/729 |
| 2006/0035415 A1 * | 2/2006 | Wood | ........... | H01L 27/14618 438/126 |
| 2006/0057858 A1 * | 3/2006 | Chung | ........... | H01L 21/3247 438/770 |
| 2006/0222477 A1 * | 10/2006 | Moura | ........... | H01L 21/681 414/217 |
| 2006/0228897 A1 * | 10/2006 | Timans | ........... | H01L 21/67115 438/758 |
| 2007/0029632 A1 * | 2/2007 | Hausner | ........... | G01J 5/046 257/E31.093 |
| 2007/0115450 A1 * | 5/2007 | Nagasaka | ........... | G03F 7/7075 355/72 |
| 2008/0106707 A1 * | 5/2008 | Kobayashi | ........... | G03F 7/70341 355/30 |
| 2008/0254553 A1 * | 10/2008 | Yoo | ........... | H01L 22/14 438/10 |
| 2009/0120924 A1 * | 5/2009 | Moffatt | ........... | B23K 26/0626 219/385 |
| 2009/0121157 A1 * | 5/2009 | Moffatt | ........... | H01L 21/268 438/795 |
| 2010/0018462 A1 * | 1/2010 | Chung | ........... | H01L 21/68735 118/708 |
| 2010/0099268 A1 * | 4/2010 | Timans | ........... | H01L 21/67115 438/758 |
| 2010/0111511 A1 * | 5/2010 | Merry | ........... | H01L 21/67115 219/385 |
| 2010/0147078 A1 * | 6/2010 | Wilby | ........... | H01L 21/67253 73/579 |
| 2011/0222072 A1 * | 9/2011 | Phillips | ........... | G01B 9/02021 356/503 |
| 2012/0208377 A1 * | 8/2012 | Timans | ........... | H01L 21/67115 257/E21.333 |
| 2012/0312790 A1 * | 12/2012 | Moffatt | ........... | B23K 26/0648 219/121.6 |
| 2013/0330064 A1 * | 12/2013 | Li | ........... | G01B 11/0625 392/407 |

FOREIGN PATENT DOCUMENTS

| | | |
|---|---|---|
| KR | 10-2002-0014704 A | 2/2002 |
| KR | 10-2003-0056248 A | 7/2003 |
| TW | 200949932 A | 12/2009 |
| TW | 201214567 A | 4/2012 |

OTHER PUBLICATIONS

Hatano Mutsuko et al: "Excimer laser-induced temperature field in melting and resolidification of silicon thin films".

Chinese Office Action for Application No. 201380025590.7 dated Aug. 29, 2016.

Taiwan Office Action for Application No. 102118086 dated Sep. 19, 2016.

Taiwan Office Action for Application No. 106108598 dated Aug. 8, 2017.

International Search Report for Application No. PCT/US2013/043461 dated Sep. 6, 2013.

European Search Report for Application No. 13803486.3 (PCT/US2013043461) dated Feb. 10, 2016.

* cited by examiner

MELT DEPTH DETERMINATION USING INFRARED INTERFEROMETRIC TECHNIQUE IN PULSED LASER ANNEALING

CROSS-REFERENCE TO RELATED APPLICATIONS

This application is a divisional of co-pending U.S. patent application Ser. No. 13/906,118, filed May 30, 2013, which application will issue on Feb. 26, 2019, as U.S. Pat. No. 10,219,325, which claims benefit of U.S. Provisional Patent Application Ser. No. 61/658,282, filed Jun. 11, 2012, both of which are incorporated herein by reference in their entireties.

BACKGROUND

Field

Technology described herein relates to methods and apparatus for in-situ measurement during pulsed laser melting.

Description of the Related Art

The fabrication of semiconductor integrated circuits has long required multiple steps of thermally processing a silicon wafer or other semiconductor wafer. The wafer may need to be raised to a temperature of 600° C. or above to thermally activate some processes. Such processes, may include, but are not limited to, chemical vapor deposition, silicidation, oxidation or nitridation, implant anneal, and dopant activation among others. Some of these processes may require temperatures in excess of 1000° C., 1200° C., or even above 1350° C., the last of which is relatively close to the melting point of silicon at 1416° C.

Pulsed laser melting (PLM) has been developed to dramatically increase the heating and cooling rates in processes such as implant annealing. PLM can lead to increased dopant activation by creating more uniform and localized melting and re-crystallization of amorphous semiconductor materials, such as for 3-dimensional memory or low-temperature poly-silicon applications.

Short pulses (about 20 ns) of laser radiation are focused at a reduced area of the wafer. The total energy of the laser pulse is sufficient to immediately heat the surface of the irradiated area to a high temperature. Thereafter, the small volume of heat generated by the shallow laser pulse quickly diffuses into the unheated lower portions of the wafer, thereby greatly increasing the cooling rate of the irradiated surface region. Several types of high-power lasers can be pulsed at a repetition rate of hundreds of pulses per second. The substrate is moved to produce a step-and-repeat pattern of the laser over the surface of the wafer and the laser is pulsed in neighboring areas to similarly thermally process the entire wafer surface.

PLM, as previously described in the art, requires determining the regrowth velocity for a material at a specific temperature, monitoring the onset and duration of melting and calculating the melt depth based on the energy input. In the past, a monitor reflectance technique is typically used on the annealing side of the sample to monitor the onset of melt and the duration of the melt.

Calculating melt depth is typically done using external analysis tools on test samples, such as secondary ion mass spectrometry (SIMS). There are currently no known techniques for in-situ analysis of melt depth during PLM. Thus, there is a need for methods and apparatus for determining melt depth during PLM processing of a substrate.

SUMMARY

Methods and apparatus for measuring the melt depth of the surface of a substrate during annealing are provided. In one embodiment, an apparatus for processing a substrate can include a heat source, a substrate support, and an interferometer. The substrate support can have a substrate contact surface, a back side opposite the substrate contact surface and an opening formed in the substrate support. The interferometer can be positioned to direct coherent radiation toward the back side and through the opening. The interferometer can include an infrared radiation source, a partially reflective mirror and a radiation sensor.

In another embodiment, a method of processing a substrate can include positioning the substrate in a thermal processing chamber, wherein the substrate comprises a first surface and a second surface, heating at least a portion of the first surface with a heat source creating a melted portion of the first surface, directing infrared spectrum radiation at a partially reflective mirror creating control radiation and interference radiation, directing the interference radiation to the second surface and directing the control radiation to a control surface, wherein the interference radiation and the control radiation at least partially reflect from the respective surfaces, and measuring the interference between reflected interference radiation and reflected control radiation.

In another embodiment, a method for processing a substrate can include positioning a substrate in an annealing chamber, wherein the substrate comprises a first surface and a second surface, heating at least a portion of the first surface of the substrate with a heat source to create a melted surface, directing coherent radiation toward the second surface of the substrate to generate reflected control radiation from the second surface of the substrate and reflected interference radiation from the melted surface, and measuring interference between the reflected interference radiation and the reflected control radiation.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods and apparatus for measuring the melt depth of the surface of a substrate during laser processing are provided. The methods and apparatus described here can allow for real time measurement of the melt depth during pulsed laser melting, such as from an pulsed laser annealing process. The embodiments are described in more detail with reference to the figures below.

Figure 1:
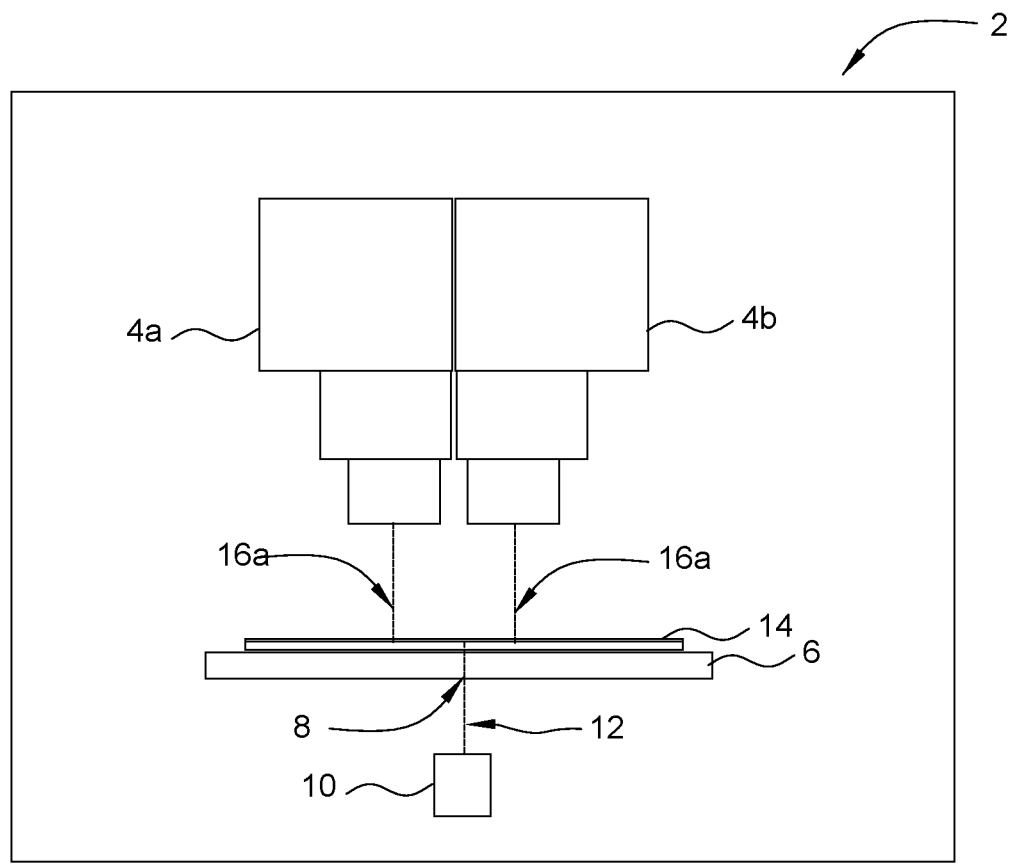
FIG. 1 is a depiction of a pulsed laser annealing chamber with a radiant interface detector according to one embodiment.

FIG. 1 is a depiction of a pulsed laser annealing chamber 2 according to one embodiment. The pulsed laser annealing chamber 2 can have one or more heat sources 4A and 4B, such as one or more lasers. Though this embodiment is depicted with only two heat sources 4A and 4B, one or more heat sources 4 (not in figure) which can move or pulse in unison or independently, an array of heat sources 4 which can move and pulse in unison or independently, or any combination of the above may be used. Each heat source 4 can consist of a single laser or a plurality of lasers which can be focused on one or more points. The heat sources 4A and 4B can be directed toward a substrate support 6.

A radiant interface detector can be disposed facing the second side of the substrate support. The radiant interface detector can be a reflective interface detector, such as an infrared (IR) interferometer. The radiant interface detector can measure the depth of melting of a substrate by using transmissive coherent radiation. Transmissive coherent radiation can be any radiation selected to provide a signal upon contacting a material interface. The radiation selected will depend on the material being analyzed. The radiation can be selected based on transmission through the substrate. For substrates composed of silicon, infrared radiation can be used.

Radiation is coherent when there is a fixed phase relationship between the electric field values at different locations or at different times. The fixed phase relationship can be separated into a spatial relationship (a.k.a. spatial coherence) and a temporal relationship (a.k.a. temporal coherence). Partial coherence means that there is at least some correlation between phase values, either spatial coherence, temporal coherence or combinations thereof. In embodiments described herein, coherent radiation can be either coherent or partially coherent. In the case of coherent radiation used in combination with the interferometer, the coherency of the radiation is only limited by the ability of the interferometer to differentiate between interference patterns from the reflected radiation.

The substrate support 6 can be positioned under the heat sources 4A and 4B and can be either mobile or stationary, based on the design of both the pulsed laser annealing chamber 2 and radiant interface detector 10. The substrate support 6 can be composed of standard materials such as aluminum. The substrate support 6 can have one or more ports 8. The ports 8 can be designed so as to accommodate the mobile or stationary radiant interface detector 10 by allowing the coherent radiation 12, such as an infrared (IR) laser beam, from the radiant interface detector 10 to penetrate the substrate support 6. Further, the ports 8 can penetrate through the substrate support 6 allowing the radiant interface detector 10 to be positioned on the second side of the substrate support 6. The ports 8 can be vary in size and shape, as is required to allow the substrate support 6 to maintain a previous functionality such as feeding a back side gas or controlling temperature of a substrate 14. The substrate 14 can be positioned on the substrate support 6 exposing the second side of the substrate to the one or more ports 8 to allow measurement of the melt depth during processing by heat from a heat source, such as heat 16A and 16B, which can be laser beams, from the heat sources 4A and 4B, which can be lasers.

Other embodiments of the ports 8 can be a recess in the substrate contact surface of the substrate support where the radiant interface detector 10 is positioned in the substrate support 6. The radiant interface detector 10 can be a single unit in the substrate support 6 and can have connections to a computer or other processing device through the second surface of the substrate support. The interference measurement may be taken at various points from the second surface to determine melting at various reference points. The detection technique for detecting position of the melted surface used here can correspond to techniques previously described or described hereafter.

Figure 2A:
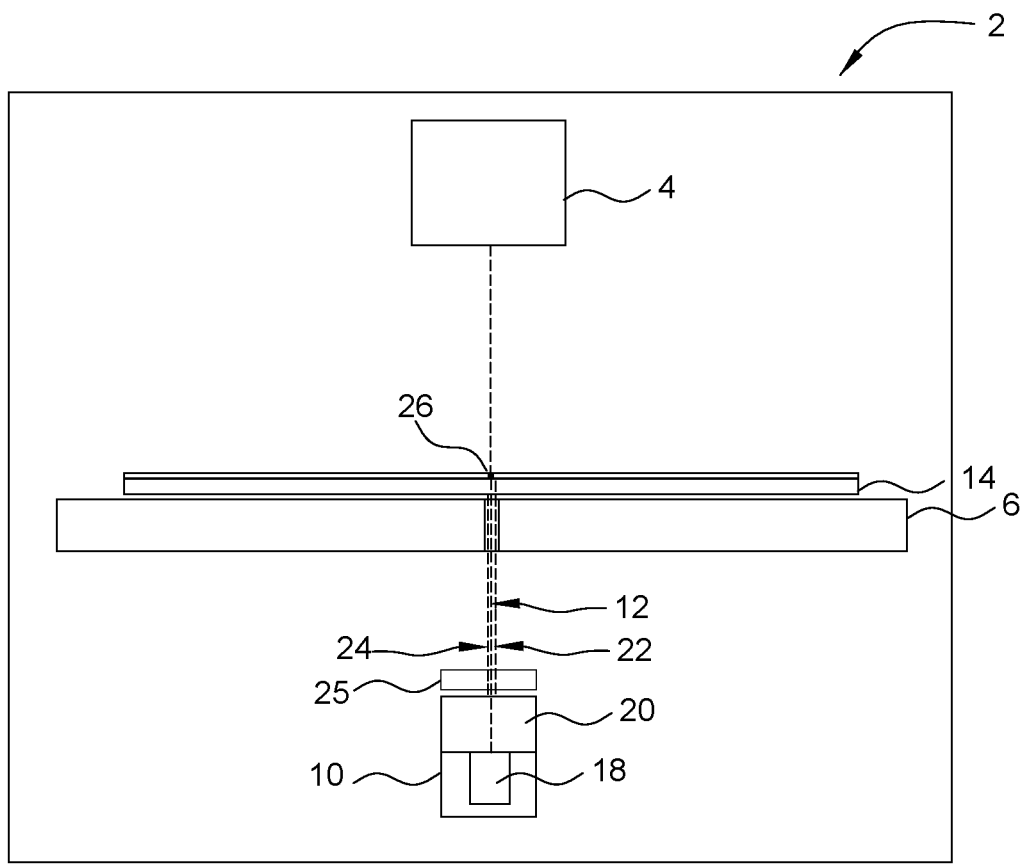
FIGS. 2A and 2B are a depiction of the substrate support usable with a stationary radiant interface detector according to one embodiment.
Figure 2B:
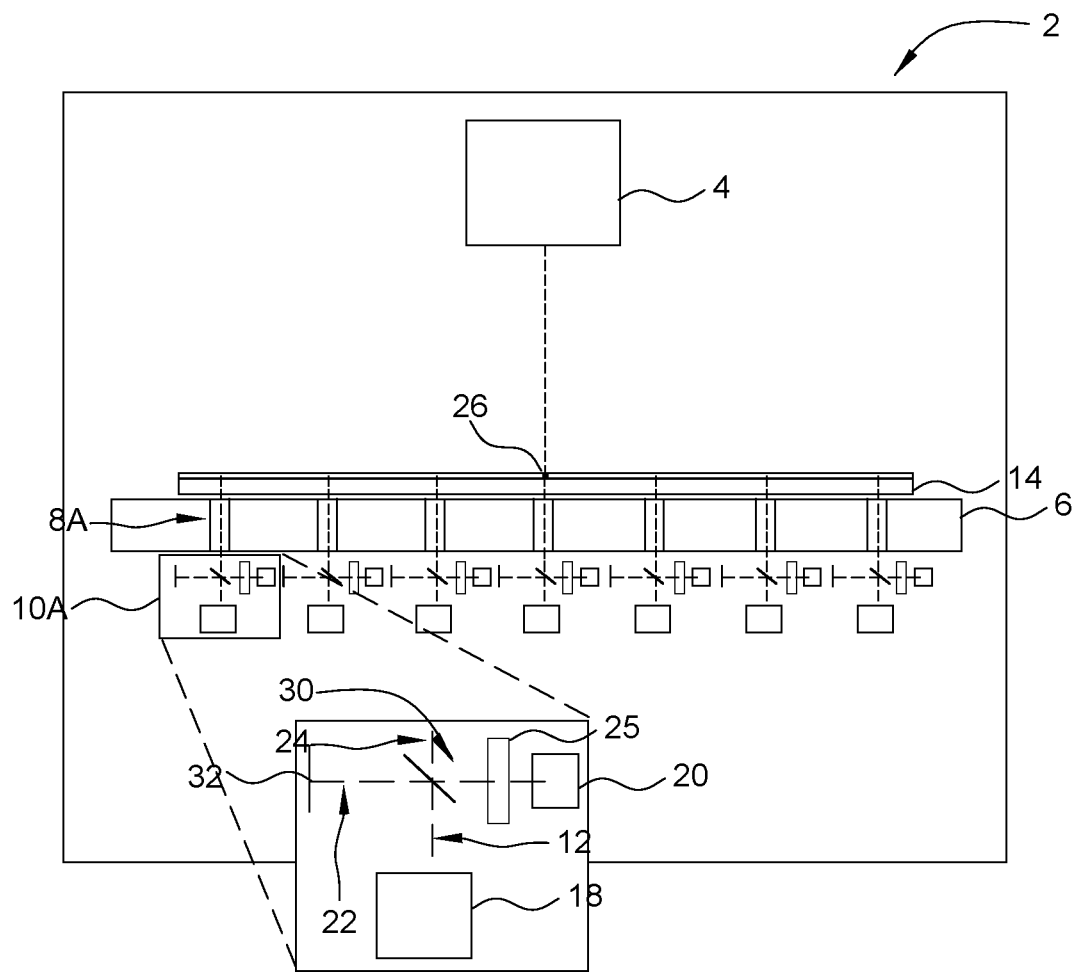

FIGS. 2A and 2B are a depiction of a substrate support usable with a stationary radiant interface detector according to one embodiment. FIG. 2A depicts a single stationary radiant interface detector design according to one embodiment. The substrate support 6 with the substrate 14 can have a port 8 and a radiant interface detector 10. The radiant interface detector 10 can be stationary directed at the port 8 on the second side of the substrate support 6. The port described here may be positioned through the body of the substrate support 6 and may be of any size or shape. Further, the port may be used with or without a lens (not shown here). The radiant interface detector 10 can include a coherent light source 18 and a radiation sensor 20, such as a photodiode. The coherent light source 18 can produce coherent radiation 12 which can pass through the port 8 of the substrate support 6 toward the second side of substrate 14.

The second side of the substrate 14 acts as a partially reflective mirror for the radiant interface detector 10, which will split the coherent radiation 12 into control radiation 22 which is reflected back to the radiation sensor 20 and interference radiation 24. The interference radiation 24 can pass through substrates that are transparent to the selected wavelength of light, such as silicon, quartz or sapphire substrates when using infrared light. A first side of the substrate 14 or a portion thereof can be melted creating a melted surface 26. The melted surface 26 is reflective to the coherent light, such as that from the interference radiation 24. The interference radiation 24 can then be reflected from the back of the melted surface 26 toward the radiation sensor 20. The interference radiation 24 can be reflected along the same path as the control radiation 22 creating a combined radiation 28. The power and the spatial shape, for example the pattern of intensity, of the combined radiation 28 along with the known thickness of the substrate 14, can then be used to determine the depth of the melted surface 26.

The radiant interface detector 10 can also include a light selective barrier 25. The light selective barrier 25 can prevent coherent radiation from passing while allowing another coherent radiation to pass freely based on physical characteristics of the radiation, for example a bandpass or long-wavelength pass filter. In one embodiment, the light selective barrier 25 can block the wavelength of coherent radiation, such as a front side laser, without affecting the transmission of interference radiation through.

Though the radiant interface detector described here uses a second side reflection of the coherent radiation to create the control radiation and the interference radiation, it is envisioned that other embodiments may be used to create the interference pattern, such as the radiant interface detector described and shown in FIG. 2B.

FIG. 2B depicts multiple stationary radiant interface detectors according to one or more embodiments. The substrate support 6 with the substrate 14 can have a plurality of ports 8A-8G each having a radiant interface detector 10A-10G in this embodiment. Though the ports 8A-8G are depicted in a line in this embodiment, it is envisioned that more or fewer ports with more or fewer radiant interface detectors may be used. Further, the linear design is not intended to be limiting of this embodiment, as the ports may be designed in any overall pattern and any overall size or shape of the parts themselves. Each radiant interface detector 10, with or without a light selective barrier 25, can be stationary facing the second side of the substrate 14 through each port 8. Each radiant interface detector 10 can include a coherent light source 18 and a radiation sensor 20, a partially reflective mirror 30 and a control surface 32. The coherent light source 18 can produce coherent radiation 12 which can partially reflect from the partially reflective mirror 30.

The partially reflective mirror 30 can be positioned at an angle, such as a 45 degree angle, to create control radiation 22 and interference radiation 24. The control radiation 22 can be redirected toward the control surface 32, which can be a highly polished and substantially flat reflecting mirror positioned perpendicular to the control radiation 22. The control surface 32 can be positioned at a known distance from the radiation sensor 20. The control radiation 22 can then be reflected back to the partially reflective mirror 30 which can redirect the control radiation 22 to the radiation sensor 20. Simultaneously, the interference radiation 24 can pass through the port 8 of the substrate support 6 toward the second side of the substrate 14. A first side of the substrate 14 can be melted creating a melted surface 26. The interference radiation 24 can then be reflected from the back of the melted surface 26 toward the radiation sensor 20. The interference radiation 24 can be reflected along substantially the same path as the control radiation 22 creating a combined radiation 28. The combined radiation 28 can pass through the light selective barrier 25, which can be selective to allow transmission of the wavelength of the combined radiation 28 while preventing other wavelengths. The power and the spatial shape of the combined radiation 28 along with the known thickness of the substrate 14 can then be used to determine the depth of the melted surface 26. These measurements can be taken simultaneously from each of the radiant interface detectors 10 providing multiple real time measurements of melt depth at the melted surface 26 of the substrate 14.

Figure 3:
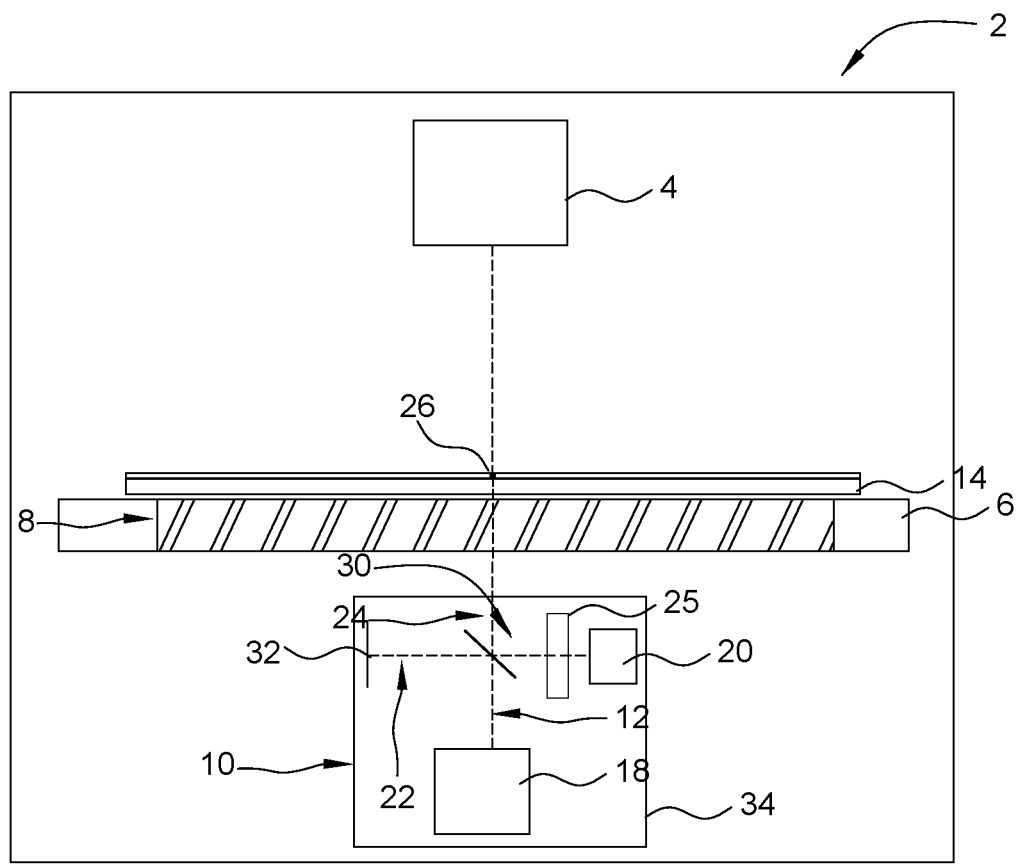
FIG. 3 is a depiction of the substrate support which can change position in relation to the radiant interface detectors.

FIG. 3 is a depiction of the substrate support which can change position in relation to the radiant interface detector. The substrate support 6 with the substrate 14 can have a single large port 8 and a radiant interface detector 10 in this embodiment. Though the port 8 is depicted as a circle and largely exposing the entire substrate in this embodiment, it is envisioned that the shape and the size of the port may be altered, such as using a square shape and focused on a specific portion of the substrate. Further, more than one radiant interface detector 10 can be used in this embodiment, such as two radiant interface detectors, where one of the radiant interface detectors can be designed to take a pre-measurement of a site on the substrate before the actual melting occurs. In one embodiment, the port can have a window which fills in the port and is transparent to the type of coherent light used, such as a quartz window for infrared coherent light.

The radiant interface detector 10 can be mobile facing the second side of the substrate 14 through the port 8. As well, the radiant interface detector 10 may be stationary and the substrate or the substrate support may move. In this embodiment, the radiant interface detector 10 follows the heat source 4, thereby allowing the radiant interface detector 10 to determine the melt depth from the heat source 4 as the melt is occurring. Each radiant interface detector 10 can include a coherent light source 18 and a radiation sensor 20, a partially reflective mirror 30 and a control surface 32. The coherent light source 18, the radiation sensor 20, the partially reflective mirror 30 and the control surface 32 can be positioned in an enclosure 34, which can be mobile. The enclosure 34 can move in unison with the heat source 4. Further, the heat source 4 can be mobile or it can be stationary. The coherent light source 18 can produce coherent radiation 12 which can partially reflect from partially reflective mirror 30.

The partially reflective mirror 30 can be positioned at an angle, such as a 45 degree angle, to create control radiation 22 and interference radiation 24. The control radiation 22 can be redirected toward the control surface 32, which can be a highly polished reflecting mirror positioned perpendicular to the control radiation 22. The control radiation 22 can then be reflected back to the partially reflective mirror 30 which can redirect the control radiation 22 to the radiation sensor 20. Simultaneously, the interference radiation 24 can pass through the port 8 of the substrate support 6 toward the second side of the substrate 14. The port 8 may be a hole or it may have a lens (not shown) that is transparent to IR light. The lens could allow for both support of the substrate support 6 and functionality such as cooling, gas flow or vacuum through the substrate support 6. A first side of the substrate 14 can be melted creating a melted surface 26. The interference radiation 24 can then be reflected from the back of the melted surface 26 toward the radiation sensor 20. The interference radiation 24 can be reflected along the same path as the control radiation 22 creating a combined radiation 28. The power and the spatial shape of the combined radiation 28 along with the known thickness of the substrate 14 can be used to determine the depth of the melted surface 26. In further embodiments, the lens can focus coherent light at the melted surface 26.

Figure 4:
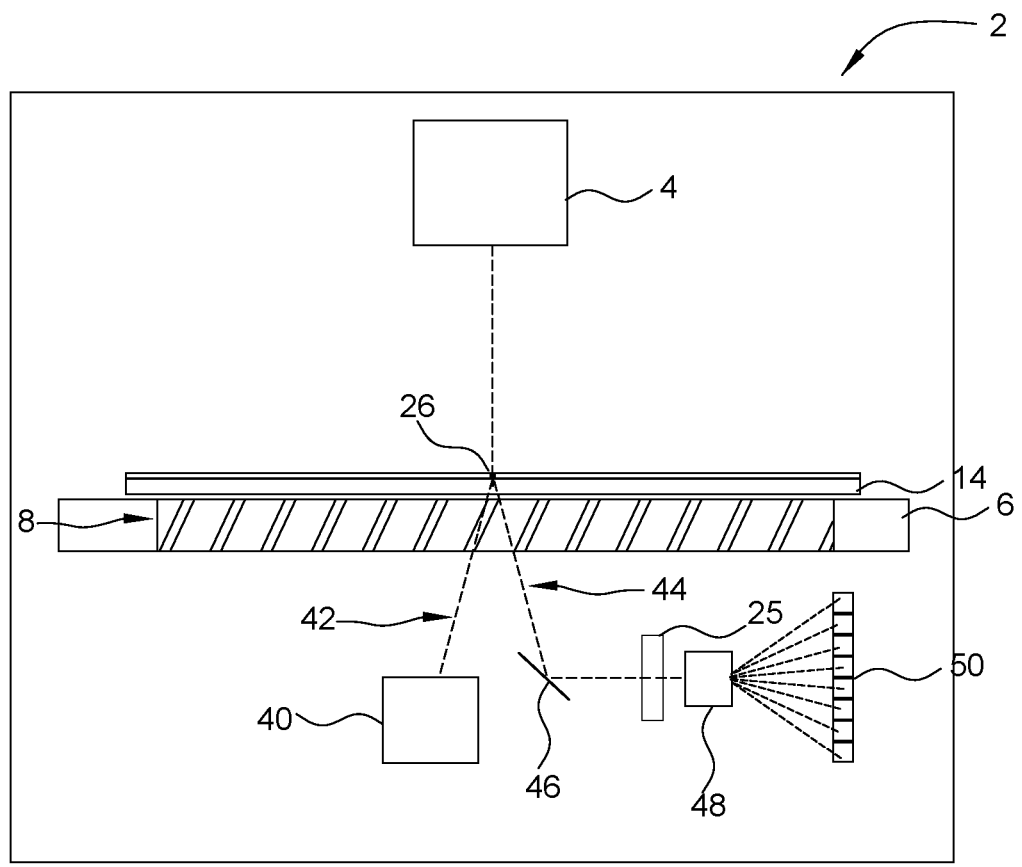
FIG. 4 is a depiction of a further embodiment employing an indirectly reflecting interferometer.

FIG. 4 is a depiction of a further embodiment employing an indirectly reflecting interferometer. As above, the substrate support 6 with the substrate 14 can have the single large port 8 and the radiant interface detector 10 in this embodiment. Though the port 8 is depicted as a circle and largely exposing the entire substrate in this embodiment, it is envisioned that the shape and the size of the port may be altered, such as using a square shape and focused on a specific portion of the substrate. Further, more than one radiant interface detector 10 can be used in this embodiment, such as two radiant interface detectors, where one of the radiant interface detectors can be designed to take a pre-measurement of a site on the substrate before the actual melting occurs. In one embodiment, the port can have a window which fills in the port and is transparent to the type of light used or to specific wavelengths of the type of light used.

The radiant interface detector 10 can include a broad spectrum light source 40, such as white light source or a LED light source. The broad spectrum light source 40 can produce a broad spectrum light 42. In some embodiments, the broad spectrum light 42 is of a known spectrum. In further embodiments, the broad spectrum light source is of a type which can maintain the spectrum of light produced over the period of use, between separate instances of uses or both. In some embodiments, the broad spectrum light 42 is directed toward a second spectrometer (not shown) prior to being directed towards the surface of the substrate 14. The second spectrometer can be used to determine the spectrum of the broad spectrum light 42 prior to being passed to the surface of the substrate or being passed through one or more The broad spectrum light 42 can be directed toward the substrate 14 at an angle, such as a 15 degree angle. The broad spectrum light 42 can then be filtered by the substrate 14. The substrate 14 can filter wavelengths based on the properties of the substrate, such as translucence or opacity to various wavelengths.

The broad spectrum light 42 which passed through the substrate 14 can then reflect from the melted surface 26 as a reflected light 44. The reflected light 44 can be redirected using a mirror 46 and through the light selective barrier 25, which can be selective to allow transmission of the wavelength of the reflected light 44 while preventing other wavelengths. Further, the light selective barrier 25 can be selective to allow transmission of a specific wavelength of the reflected light 44 while preventing other wavelengths. The reflected light 44 can then be directed to a spectrometer 48. The spectrometer 48 can measure the spectrum of the reflected light 44 returned from the melted surface 26. As well the spectrometer can redirect the reflected light 44 to one or more radiation sensors 50, such as a photodiode array. The one or more radiation sensors 50 can detect similar parameters to the radiation sensor 20 with relation to the spectrums of light which were returned from the melted surface 26.

Figure 5:
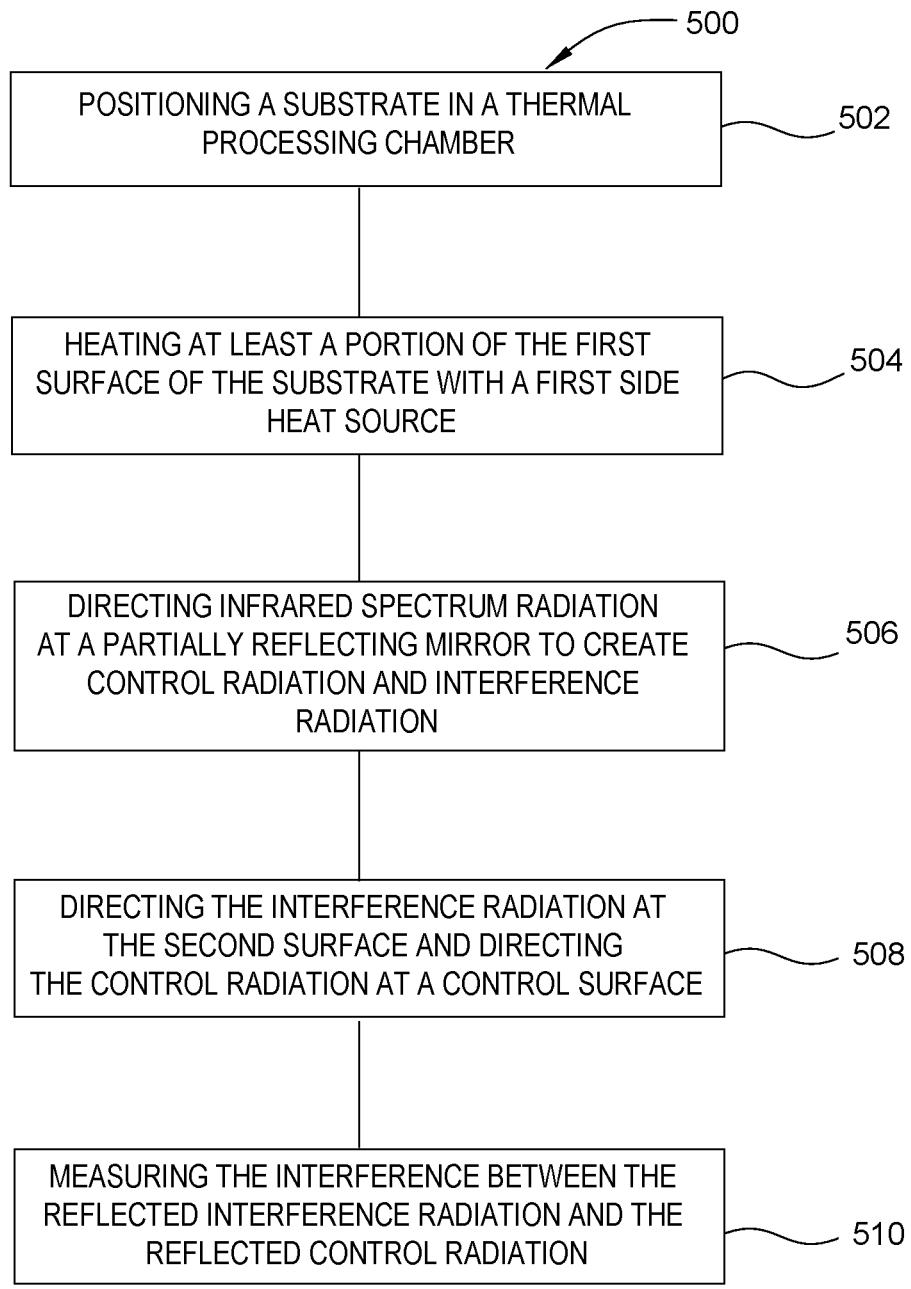
FIG. 5 is a flow diagram summarizing a method according to one embodiment.

Further embodiments can position the light selective barrier 25 as the optional window of the port 8. As such, the same light selective barrier 25 could be used for more than one broad spectrum light source 40. In embodiments which use a second spectrometer, the broad spectrum light 42 can be split using a partially reflective mirror and directing one portion of the broad spectrum light toward the second spectrophotometer. Further embodiments can have the second spectrophotometer in the path of the broad spectrum light 42 as directed at the substrate 14. The second spectrometer FIG. 5 is a flow diagram summarizing a method of measuring melt depth using a radiant interface detector according to one embodiment. A radiant interface detector is an optical device which utilizes the effect of interference to determine changes between a control and a test sample, in this case the difference between the distance to the control radiation reflection point and the distance to the interference radiation reflection point. Measuring interference generally starts with coherent radiation (e.g. an IR laser beam), which is split it into control and interference radiation with a radiation splitter (e.g. a partially reflective mirror). The interference radiation is exposed to some external influences (e.g. changes in the path length or refractive index changes in a transparent medium as compared to the control radiation), and recombines the radiations on another radiation splitter which can be the same partially reflective mirror. This discussion is simplified for purposes of explanation and does not take account of other known factors related to light transmission, such as internal absorbance and loss during reflection.

The method 500 can include positioning a substrate in a thermal processing chamber, such as an annealing chamber, as in 502. The substrate support in the annealing chamber can be particularly designed for the process by allowing for penetration of the coherent radiation. The methods described herein are amenable to any processing chamber which can be used for laser melting of the first side of a substrate. Particular embodiments can be employed in a pulsed laser annealing chamber, such as the annealing chamber described in U.S. application Ser. No. 13/194,552, entitled "Novel Thermal Processing Apparatus", incorporated herein by reference.

The method 500 can further include heating at least a portion of the first surface of the substrate with a heat source creating a melted surface, as in 504. As part of the pulsed laser annealing process, one or more heat sources can be directed at the first surface of the substrate, which can be used to melt the first surface. The entire first surface is generally not melted at any given time in pulsed laser annealing. The coherent radiation can be homogenized and flowed through an aperture to provide equal distribution of intensity and remove fringe areas from the coherent radiation respectively. Based on this embodiment, the radiant interface detector can detect the melt depth under the heat from the heat source as the melt occurs.

The method 500 can further include directing infrared spectrum radiation at a partially reflective mirror to create control radiation and interference radiation, as in 506. The coherent radiation, when it strikes the partially reflecting surface, a portion of the radiation is reflected toward the control arm. The remaining portion of the coherent radiation continues through the partially reflective mirror creating the interference radiation. The coherent radiation can be homogenized or passed through an aperture to produce more uniform coherent radiation prior to coming in contact with the partially reflective mirror.

The method 500 can further include directing the interference radiation at the second surface of the substrate and directing the control radiation at the control surface, wherein the radiation at least partially reflects from the respective surfaces, as in 508. The control surface can have a highly polished reflective surface to reflect a large proportion of the radiation it receives. Further embodiments can include a control surface which reflects a known portion or a measured proportion of the radiation it receives. The control radiation reflected from the control surface can be directed back at the radiation sensor through the partially reflective mirror. The interference radiation can be directed at the second surface of the substrate.

As the surface of the substrate melts due to the heat source, the interface between the melted surface and the non-melted underside moves lower in the substrate. The change in depth may be less than a micron over a set period of time. However, the interface between the melted surface and the non-melted substrate creates a mirror-like surface for the interference radiation. As the interface is moving with the increase in melted surface, the interface can be used to determine the overall depth of the melt in comparison to a known control distance.

The method 500 can further include measuring the interference between the reflected interference radiation and the reflected control radiation, as in 510. The control radiation and the interference radiation are reflected back at the radiation sensor, which can be used to detect changes in the power and the spatial shape of the interference radiation and the control radiation.

Without intending to be bound by theory, when two waves are superposed, the output wave depends on the phase between the input waves. If two radiations with the same wavelength, i.e. same frequency, travel from two different points towards the same destination, taking different paths there will be a difference in the length of the optical paths. The difference in the optical path is the optical path difference (OPD). The change in the distance travelled can be visualized as interference fringes. Intensity of interference fringes depends on the phase between the recombined waves. Since the combined radiation will produce interference fringes based on the phase of the combined waves, the periodicity of the interference fringes can be used to precisely calculate the distance from the mirrored interface surface. Data collected at the radiation sensor with regard to the combined radiation can then be processed via a computer program to provide precise real time measurement of the melt depth.

Figure 6:
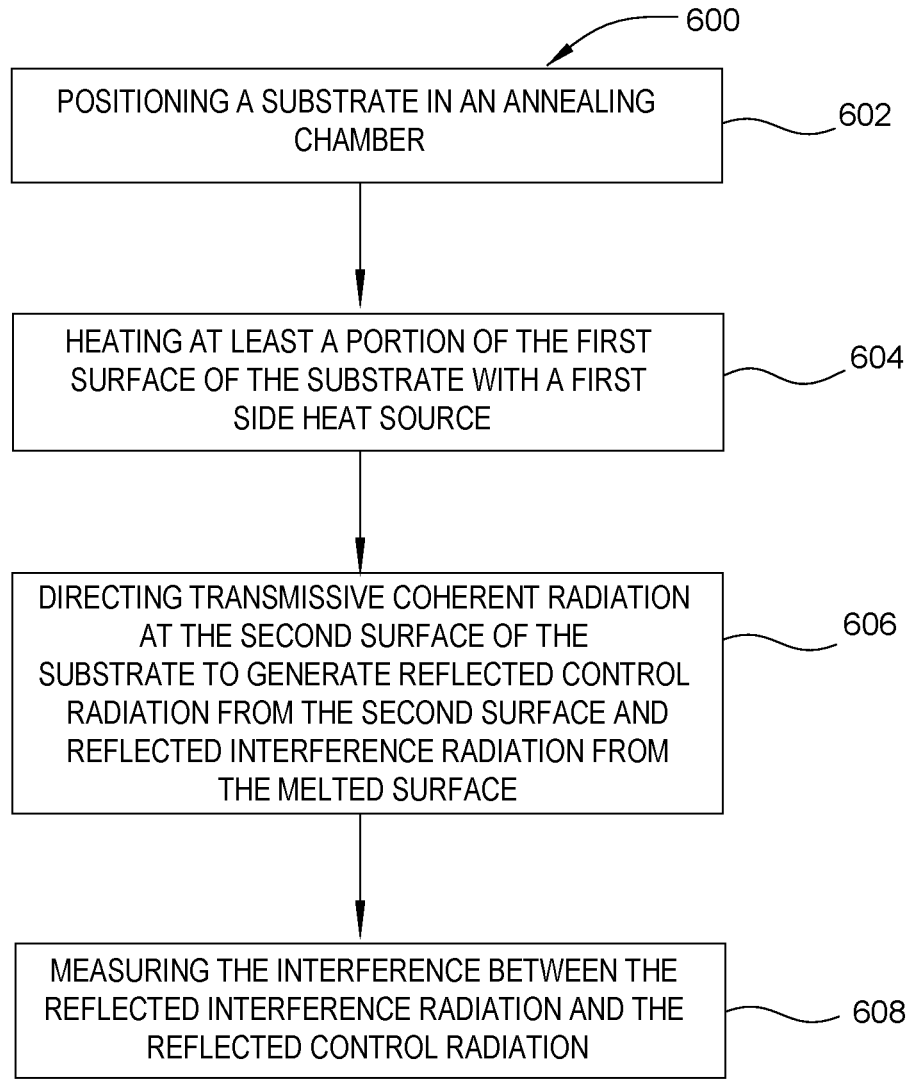
FIG. 6 is a flow diagram summarizing a method according to another embodiment.

FIG. 6 is a flow diagram summarizing a method according to another embodiment. The method 600 can include positioning a substrate in an annealing chamber, as in 602. The annealing chamber can be any type of annealing chamber which anneals one portion of a substrate leaving another portion of the substrate comparatively unaffected. The substrate support and the annealing chamber can be of the same general type as described with reference to FIG. 5 above.

The method 600 can further include heating at least a portion of the first surface of the substrate with a heat source creating a melted surface, as in 604. As described with reference to FIG. 5, the melted surface creates a reflective surface which can be used to determine the overall depth of the melt.

The method 600 can further include directing transmissive coherent radiation at the second surface of the substrate to generate reflected control radiation from the second surface and reflected interference radiation from the melted surface, as in 606. In this embodiment, the partially reflective mirror can be the rear surface of the substrate. The rear surface of the substrate can act to reflect the control radiation back to the radiation sensor for purposes of measuring based on interference. This embodiment is not restricted to a particular port size or shape and this embodiment can be used with either the mobile or stationary versions of the radiant interface detector or substrate support. The interference radiation will reflect from the interface between the melted surface and the non-melted substrate to recombine with the control radiation and return to the radiation sensor. The produced interference fringes or other interference based metrics, such as measurement of the time for the radiation to travel back to the source, can then be used to determine the melt depth. For example, melt depth can be determined based on known thickness of the substrate, known distance to the rear surface of the substrate and the interference fringes from the combined radiation.

The method 600 can further include measuring the interference between the reflected interference radiation and the reflected control radiation, as in 608. The control radiation and the interference radiation are reflected back at the radiation sensor, which can be used to detect changes in the power and the spatial shape of the interference radiation and the control radiation as described with reference to FIG. 5.

It is important to note that measurement of the melted surface can be accomplished by a time-based mechanism as well. Separate from an interference based technique or in conjunction with an interference based technique, a time based technique could be applied using coherent radiation. The transmissive coherent radiation would reflect from the melted surface back to a radiation sensor. The time that the radiation travelled from the radiation source to the melted surface and to the radiation sensor can be used to calculate the distance that the radiation travelled. The precision of the measurement can be increased by changing the length that the radiation travels before reaching the radiation sensor, thereby reducing the effect of measurement error.

Methods and apparatus for measuring the melt depth of the surface of a substrate during laser processing are provided. The methods and apparatus described here can allow for real time measurement of the melt depth during pulsed laser melting, such as from an pulsed laser annealing process. In one embodiment, a method for determining melt depth can include positioning a substrate in an annealing chamber, heating at least a portion of the first surface of the substrate with one or more heat sources, directing coherent radiation at a partially reflective mirror, creating control radiation and interference radiation, directing the interference radiation at the second surface and directing the control radiation at a control surface, and measuring the interference between the reflected interference radiation and the reflected control radiation. The partially reflective mirror can be a separate partial mirror or reflection from the second side of the substrate. An apparatus for measuring melt depth can include a pulsed laser annealing chamber with one or more radiant interface detectors as described above. The radiant interface detectors can produce an interference fringe pattern which can be used to determine the precise melt depth, as created by the heat source in the surface of the substrate. The methods and apparatus described herein provide a means for real time measurement of melt depth during pulsed laser anneal, thus allowing for adjustments in parameters during the melt and prevent loss of or damage to the substrate as well as precise control of previously non-measurable parameters in situ.

While the foregoing is directed to implementations of the present disclosure, other and further implementations of the disclosure may be devised without departing from the basic scope thereof, and the scope thereof is determined by the claims that follow.

What is claimed is:

1. A method of processing a substrate, comprising:
heating a reduced area of a first surface of the substrate to form a melt interface between the first surface and a second surface of the substrate that is opposite the first surface;
directing interference radiation towards the melt interface through the second surface;
directing a control radiation to a control surface;
receiving, at an interference detector, interference radiation reflected by the melt interface and control radiation reflected by the control surface; and
determining a depth of the melt interface from the first surface based on an interference pattern between the reflected interference radiation and the reflected control radiation.

2. The method of claim 1, wherein a plurality of reduced areas of the substrate are concurrently heated by directing focused radiation at each, and the method comprises concurrently determining the depth of the melt interface at each of the plurality of reduced areas.

3. The method of claim 1, wherein the control surface is a mirrored surface.

4. The method of claim 1, wherein the substrate comprises silicon.

5. The method of claim 1, further comprising directing a coherent radiation towards a partially reflective mirror to generate the interference radiation and the control radiation.

6. The method of claim 1, wherein heating the reduced area of the first surface comprises directing a second coherent radiation there towards.

7. A method for processing a substrate, comprising:
heating a reduced portion of the substrate to form a melt interface in the substrate between a first surface and a second surface opposite the first surface; and
determining a melt interface depth, comprising:
receiving, at an interference detector, interference radiation reflected by the melt interface and control radiation reflected by a control surface; and
determining a distance of the melt interface from the first surface based on an interference pattern between the interference radiation and the control radiation.

8. The method of claim 7, wherein
heating the reduced portion of the substrate comprises directing pulsed laser radiation towards a reduced area of the first surface,
the pulsed laser radiation has a first wavelength,
the interference radiation and the control radiation each has a second wavelength, and
the interference radiation and the control radiation received at the interference detector are passed through a light selective barrier configured to block radiation having the first wavelength.

9. The method of claim 7, wherein
determining the melt interface depth comprises directing coherent radiation from a coherent radiation source towards the melt interface through the second surface,
the control surface is the second surface of the substrate, and
the control radiation comprises coherent radiation reflected by the second surface.

10. The method of claim 7, wherein determining the melt interface depth comprises:
directing coherent radiation from a coherent radiation source towards a partially reflective mirror to generate the interference radiation and the control radiation; and
directing, by use of the partially reflective mirror, the interference radiation towards the melt interface and the control radiation towards a mirrored control surface, wherein the partially reflective mirror is positioned between the coherent radiation source and the second surface of the substrate.

11. The method of claim 10, wherein the mirrored control surface is parallel to a direction of the coherent radiation directed from the coherent radiation source to the partially reflective mirror.

12. A method of processing a substrate, comprising:
positioning the substrate on a substrate support disposed within a processing chamber, the substrate support having a substrate supporting side and a backside surface opposite the substrate supporting side, the processing chamber comprising:
a laser source positioned to direct focused laser radiation at a reduced area of a first surface of the substrate; and
a radiant interface detector positioned to receive interference radiation reflected through a second surface of the substrate that is opposite the first surface, the radiant interface detector comprising a radiation source, and a radiation sensor;
directing laser radiation from the laser source towards the reduced area of the first surface to form a melt interface between the first surface and the second surface;
receiving, at the radiation sensor, interference radiation reflected by the melt interface and control radiation reflected by a control surface; and
determining, based on an interference pattern between the interference radiation and the control radiation received at the radiation sensor, a distance of the melt interface from the first surface of the substrate.

13. The method of claim 12, wherein the radiant interface detector is at least partially disposed beneath the backside of the substrate support.

14. The method of claim 12, wherein a plurality of openings are formed through the substrate support between the substrate supporting side and the backside, and
the radiation sensor receives the reflected interference radiation through one of the plurality of openings.

15. The method of claim 12, wherein the radiant interface detector further comprises a light selective barrier configured to selectively filter a wavelength corresponding to the laser radiation, and the reflected interference radiation and the reflected control radiation received at the radiation sensor are passed through the light selective barrier.

16. The method of claim 12, wherein the radiant interface detector is an infrared interferometer.

17. The method of claim 12, wherein
the radiant interface detector further comprises a partially reflective mirror positioned to receive coherent radiation from the radiation source and direct interference radiation towards a portion of the second surface of the substrate that is opposite of the reduced area of the first surface, and
the control surface is parallel to a direction of the coherent radiation directed from the radiation source to the partially reflective mirror.

18. The method of claim 12, wherein the substrate support further comprises a lens disposed between the substrate supporting side and the backside, and the lens is transparent to the interference radiation.

19. The method of claim 12, wherein the radiant interface detector is at least partially disposed in the substrate support between the substrate supporting side and the backside.

20. The method of claim 12, further comprising directing coherent radiation from a coherent radiation source towards the melt interface through the second surface, wherein
the control surface is the second surface of the substrate, and
the control radiation comprises coherent radiation reflected by the second surface.

* * * * *